United States Patent
Park et al.

(10) Patent No.: US 8,786,004 B2
(45) Date of Patent: Jul. 22, 2014

(54) 3D STACKED ARRAY HAVING CUT-OFF GATE LINE AND FABRICATION METHOD THEREOF

(75) Inventors: Byung-Gook Park, Seoul (KR); Seongjae Cho, Seoul (KR); Won Bo Shim, Seoul (KE)

(73) Assignee: SNU R&DB Foundation (KR)

( * ) Notice: Subject to any disclaimer, the term of this patent is extended or adjusted under 35 U.S.C. 154(b) by 502 days.

(21) Appl. No.: 13/023,646

(22) Filed: Feb. 9, 2011

(65) Prior Publication Data
US 2011/0241098 A1 Oct. 6, 2011

(30) Foreign Application Priority Data
Apr. 5, 2010 (KR) .......................... 10-2010-0030748

(51) Int. Cl.
*H01L 29/792* (2006.01)
(52) U.S. Cl.
USPC .................... 257/324; 257/314; 257/E29.309
(58) Field of Classification Search
CPC ................................................ H01L 27/11578
USPC ........................... 257/314–316, 324, E29.309
See application file for complete search history.

(56) References Cited

U.S. PATENT DOCUMENTS

| 6,878,991 | B1 | 4/2005 | Forbes |
| 7,514,321 | B2 * | 4/2009 | Mokhlesi et al. ............. 438/259 |
| 2008/0296659 | A1 | 12/2008 | Park et al. |
| 2009/0207667 | A1 | 8/2009 | Park et al. |
| 2009/0310425 | A1 * | 12/2009 | Sim et al. ................ 365/185.29 |
| 2010/0140685 | A1 * | 6/2010 | Kang et al. .................... 257/324 |

* cited by examiner

*Primary Examiner* — Allison P Bernstein
(74) *Attorney, Agent, or Firm* — Gerald E. Hespos; Michael J. Porco; Matthew T. Hespos (57) ABSTRACT

A three-dimensional stacked flash memory array having cut-off gate line and a fabricating method of the same are provided. The flash memory array enables to operate two memory cells by each word line, to produce a high integrity without limitation by vertical stacks of word lines, to increase operating speed and uniformity of electrical property between cells by using a single crystal substrate as a channel region, and to reduce a fabricating cost to a great amount by a fabricating method which is including steps of forming a plurality of trenches in a semiconductor substrate and stacking repeatedly a conductive material interlaid with an insulating layer from bottom of each trench to form a cut-off gate line and a plurality of word lines.

10 Claims, 14 Drawing Sheets

3D STACKED ARRAY HAVING CUT-OFF GATE LINE AND FABRICATION METHOD THEREOF

CROSS-REFERENCE TO RELATED APPLICATION

This application claims priority under 35 U.S.C. 119 of Korean Patent Application 10-2010-0030748 filed on Apr. 5, 2010, the entire contents of which are hereby incorporated by reference.

BACKGROUND OF THE INVENTION

1. Field of the Invention

The present invention relates to a flash memory array and a method for fabricating the same, and more particularly to a three-dimensional (3D) stacked array having cut-off gate line which enables to operate two memory cells by each word line, to produce a high integrity without limit by vertical stacks of word lines, to increase operating speed and uniformity of electrical property between cells by using a single crystal substrate as a channel region, and to reduce a fabricating cost to a great amount by forming a plurality of trenches in a semiconductor substrate and stacking repeatedly conductive materials interlaid with an insulating layer to have a cut-off gate line and a plurality of word lines from bottom of each trench.

2. Description of the Related Art

These days, flash memories have been becoming popular as non-volatile memories with possibilities of a low power operation and a high integrity. Because main subject leading semiconductor industry shifts personal computers to mobile electric instruments, importance and demand of flash memories have been more increasing.

A conventional flash memory is classified as code flash memory and data flash memory according to its application. The code flash memory uses a NOR type structure flash memory having a short random access time, and the data flash memory uses a NAND type structure flash memory having a short writing time and a high integrity.

Particularly, NAND type flash memories, which have a high integrity because it is unnecessary to form contacts of source and drain on each memory cell, have been used mainly as large capacity storages in portable disks, digital cameras, video recorders, audio recorders and so on.

To meet the above-mentioned demands, flash memory technologies for a high integrity, a low power and a high speed operation are developed continuously.

Recently, because of some limitations in improving integrity degree by cell size reduction based on planar structure, memory arrays having three-dimensional structures have been developing.

The representative prior arts having the three-dimensional structures were described in U.S. Pat. No. 6,878,991 B1 and Korean patent number 777016 of the same inventors of the present invention.

In the prior arts, both embody word lines on each side wall to reduce required areas of total array to a great amount and to produce high integrity. However, the former invention is difficult to make practical use by some problems in fabricating process. Although the latter had an advantage of putting the former to practical use, it has limitation in improving integrity degree due to the formation of a control gate (i.e., word line) per memory cell and the requirement of interval for separating the control gates.

In order to solve the problems in the Korean patent number 777016, Korean patent application number 10-2008-0014125 was filed by the same inventors of the present invention and it was published as Korean publication number 10-2009-0088693.

According to the Korean patent application number 10-2008-0014125, the areas of the interval for separating control gates were reduced by forming one control gate (word line) between two memory cells having a vertical channel and one cut-off gate line under the one control gate in a folded 3D pillar structure. However, it has also limitation in improving integrity degree due to the formation of one control gate (word line) per trench.

SUMMARY OF THE INVENTION

Technical Problem

To solve the problem, the present invention is directed to a 3D stacked flash memory array and a method for fabricating the same, wherein the 3D stacked array having cut-off gate line enables to operate two memory cells by each word line, to produce a high integrity without limit by vertical stacks of word lines, to increase operating speed and uniformity of electrical property between cells by using a single crystal substrate as a channel region, and to reduce a fabricating cost to a great amount by forming a plurality of trenches in a semiconductor substrate and stacking repeatedly a conductive material interlaid with an insulating layer to have a cut-off gate line and a plurality of word lines from bottom of each trench.

Technical Solution

To achieve the objective of the present invention, a 3D stacked array having cut-off gate line is characterized by including one or more insulator strips with projected insulating pillars at a regular interval on an etched semiconductor substrate; one or more semiconductor strips with projected semiconductor pillars parallel to and between the insulator strips; one or more trenches formed by the one or more insulator strips and the one or more semiconductor strips; a cut-off gate line formed on a gate insulating layer in the lower part of each trench; insulating layers with a charge storage layer formed on each side wall of each trench; and two or more word lines stacked on the cut-off gate line in each trench interlaying with an interlayer insulating layer, wherein the upper part of each projected semiconductor pillar is doped with impurities to have an impurity-doped layer and to form a bit line by each semiconductor strip.

The invention also relates to a method for fabricating a 3D stacked array having cut-off gate line is characterized by comprising a first step of forming semiconductor fins by etching a prepared semiconductor substrate with using a first etching mask formed on the substrate; a second step of depositing an insulating material on a whole surface of the substrate to fill between the semiconductor fins and etching the insulating material for planarization; a third step of forming one or more insulator strips with projected insulating pillars by forming a second etching mask in a vertical direction to the first etching mask on the planarized substrate and etching the exposed first etching mask and the exposed insulating material filled between the semiconductor fins with using the second etching mask; a fourth step of forming one or more trenches by forming one or more semiconductor strips with projected semiconductor pillars neighbor and parallel to each insulator strip, wherein the one or more semiconductor strips are formed by etching the semiconductor fins with using the remained first etching mask covered with the second etching mask; a fifth step of forming a gate insulating layer at least on each semiconductor strip in the trench; a sixth step of forming a cut-off gate line on the gate insulating layer in each trench by depositing and etching a conductive material on a whole surface of the substrate; and a seventh step of forming insulating layers with a charge storage layer on each side wall of each trench and stacking two or more word lines on the cut-off gate line in each trench interlaying with an interlayer insulating layer from by depositing and etching an insulating material and a conductive material repeatedly on a whole surface of the substrate.

Advantageous Effect

The present invention can form a plurality of trenches from one or more insulator strips and semiconductor strips formed by etching a semiconductor substrate to have a pillar structure respectively and form a cut-off gate line and a plurality of word lines by stacking repeatedly conductive material interlaid with an insulating layer from bottom in each trench. Thus the present invention enables to operate two memory cells with each word line by the cut-off gate line, to produce a high integrity without limit by vertical stack of word lines, to increase operating speed and uniformity of electrical property between cells by using a single crystal substrate as a channel region, and to reduce a fabricating cost to a great amount.

BRIEF DESCRIPTION OF THE DRAWINGS

The invention may be better understood by the drawings that are briefly described below and attached hereto, in the several figures of which identical reference numbers (if any) refer to identical or similar elements.

DETAILED DESCRIPTION OF THE PREFERRED EMBODIMENTS

The following reference numbers are used throughout the drawings: reference number 10 indicates a semiconductor substrate (a silicon substrate), 14 identifies a semiconductor strip, 16 identifies an impurity-doped layer, 56 identifies an insulator strip, 82 identifies a gate insulating layer, 83 identifies a charge storage layer (a nitride layer), 85, 85' and 87 identify a blocking oxide layer, 100 identifies an active region, 110 identifies a field region against an active region, 200 identifies a first selective transistor, and 300 identifies a second selective transistor.

A detailed description of preferred embodiments of the present invention is provided below with respect to accompanying drawings. Because the drawings are illustrated the embodiments of the array structure and the fabricating method thereof according to the present invention to understand by a person with ordinary skill in the art, any drawings can be used to refer to understand each embodiment. However, the technical idea of the present invention has to be not limited to the drawings and the embodiments described herein. Also, it is considered to refer the drawings that the same material layers in the accompanying drawings are painted with the same color and tagged with the same reference number for drawing convenience, but if the structure is changed, a different reference number is tagged.

As shown in FIGS. 11, 22, 24 and 25, a 3D stacked array having cut-off gate line of the present invention is characterized by including one or more insulator strips 56 with projected insulating pillars at a regular interval on an etched semiconductor substrate; one or more semiconductor strips 14 with projected semiconductor pillars parallel to and between the insulator strips; one or more trenches 42 formed by the one or more insulator strips and the one or more semiconductor strips; a cut-off gate line 92 formed on a gate insulating layer 82 in the lower part of each trench; insulating layers 84' and 86 with a charge storage layer 83 formed on each side wall of each trench; and two or more word lines 94 and 96 stacked on the cut-off gate line 92 in each trench interlaying with an interlayer insulating layer 84' or 87 from each bottom side of each trench, wherein the upper part of each projected semiconductor pillar is doped with impurities to have an impurity-doped layer 16 and to form a bit line by each semiconductor strip.

The above configuration, by including one or more trenches 42 made of one or more insulator strips 56 and one or more semiconductor strips 14 formed by etching a semiconductor substrate 10 and a cut-off gate line and a plurality of word lines formed by stacking repeatedly a conductive material interlaid with an insulating layer from bottom of each trench, enables to operate two memory cells with one word line by the cut-off gate line and also to increase an integrity degree without limitation by a vertical stack of the word lines.

Here, it is preferable to use a single crystal substrate as the semiconductor substrate 10, when using a single crystal silicon substrate, each semiconductor strip 14 can be also formed with the single crystal silicon. By doing this, a channel region of each memory cell is finally formed with the single crystal silicon. As a result, this embodiment has the merits of improving an electric current of turn on state of the cells, increasing operating speed, and keeping uniformity of electrical property between cells more than the conventional stacked structures having a channel region deposited with a polycrystalline or an amorphous semiconductor material.

Figure 22:
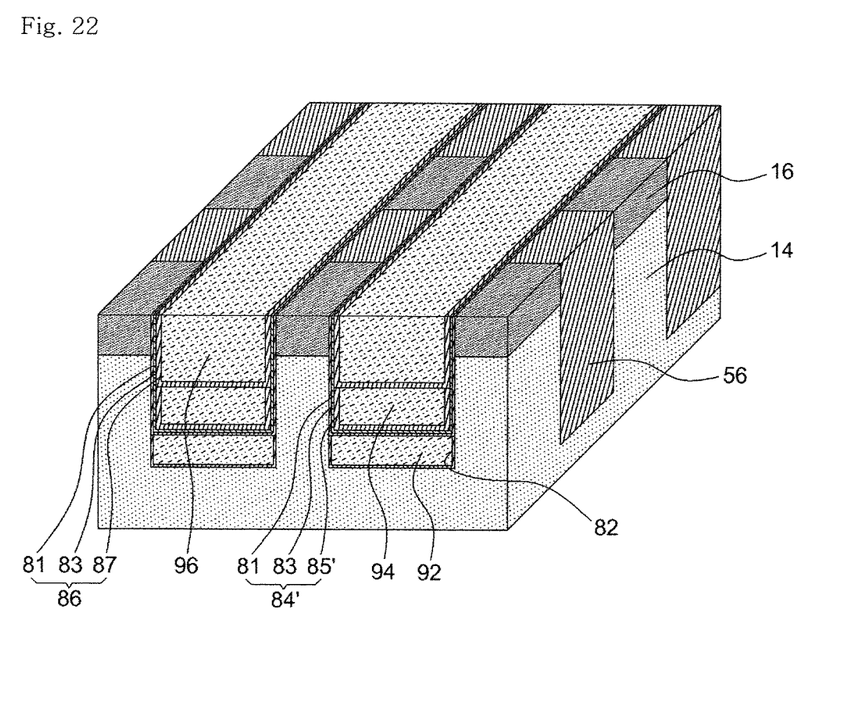
Figure 23:
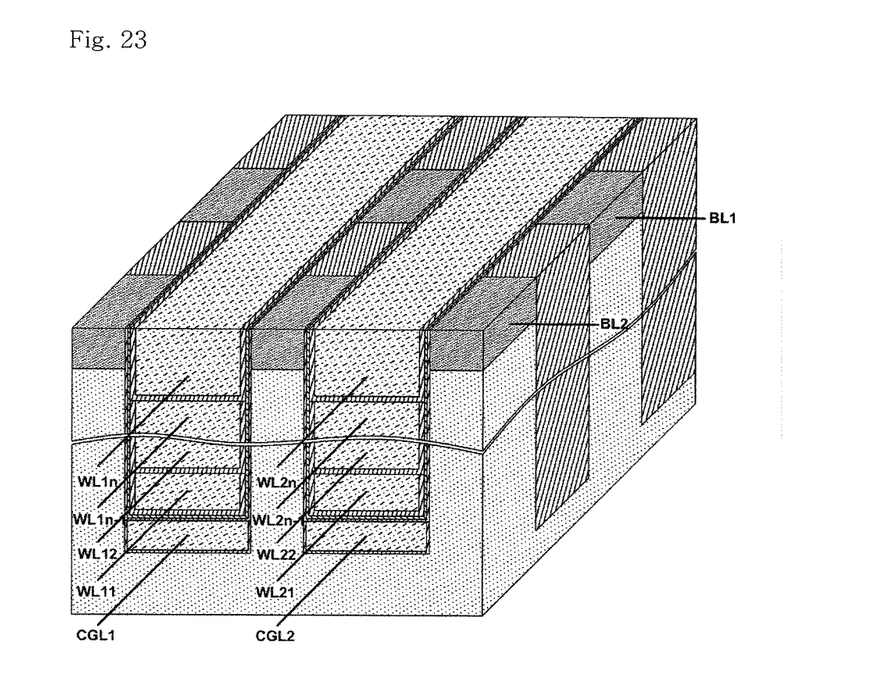
FIG. 23 is a partial perspective view showing one example of structure of a 3D stacked array having cut-off gate line of the present invention.

Also, as shown in FIGS. 22 and 23, a gate insulating layer 82 as like as a thermal oxidation layer is formed from bottom of each trench 42 and the cut-off gate line 92 (CGL1, CGL2) is preferentially formed with a metal or an impurity-doped semiconductor (e.g., an impurity-doped poly silicon, an impurity-doped amorphous silicon and so on) on the gate insulating layer 82.

Two or more word lines 94 and 96 are formed by depositing repeatedly a conductive material, as like as the material of the cut-off gate line 92, interlaying with a interlayer insulating layer 84' or 87 on the cut-off gate line 92.

Here, as shown in FIGS. 22 and 23, a first interlayer insulating layer placed between the cut-off gate line 92 (CGL1 or CGL2) and the first word line 94 (WL11 or WL21) can be the same as insulating layers 84' including a charge storage layer 83 formed on each side wall of the trench and the other interlayer insulating layers can be the same as a insulating layer 87 of insulating layers 86 including a charge storage layer 83 formed on each side wall of the trench. However, as another embodiment, the other interlayer insulating layers can also be the same as the insulating layers 84' with a charge storage layer 83 as like as the first interlayer insulating layer.

Because the charge storage layer 83 is preferable to make up with an insulating material (e.g., a nitride layer) that has charge trapping characteristic, the insulating layers 84' with the charge storage layer 83 can be made up with an ONO layer (i.e., a tunneling oxide layer/nitride layer/blocking oxide layer).

For one embodiment, FIG. 22 shows a structure stacked with two word lines 94 and 96 in each trench 42, but, as shown in FIG. 23, the word lines can be stacked so two or more times depending on the depth of the trench 42. FIG. 23 shows a structure stacked n times with n word lines (WL11, WL12, WL1n-1, WL1n; WL21, WL22, WL2n-1, WL2n) in each trench 42.

Because, as shown in FIG. 22, the impurity-doped layer 16 is formed in the upper part of each projected semiconductor pillar of each semiconductor strip 14, one bit line (BL1 or BL2) can be formed by each semiconductor strip 14 as shown in FIG. 23.

Figure 21:
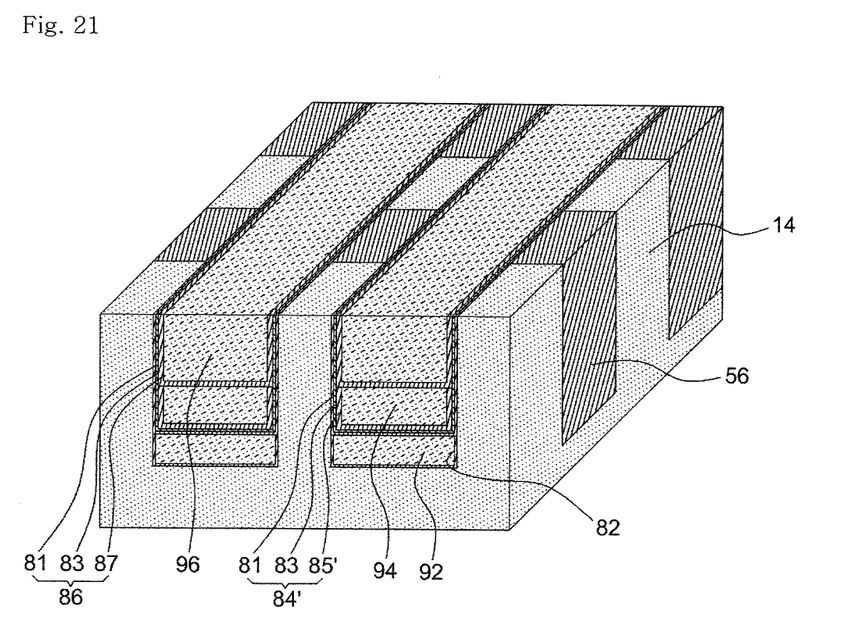

Here, as shown in FIG. 21, each semiconductor strip 14 is indicated basically as a strip shape having semiconductor pillars which are projected at a regular interval by etching a semiconductor substrate 10 and can be defined as a neighboring semiconductor region made contact with and had the same shape with each insulating strip 56 having projected pillars.

Figure 24:
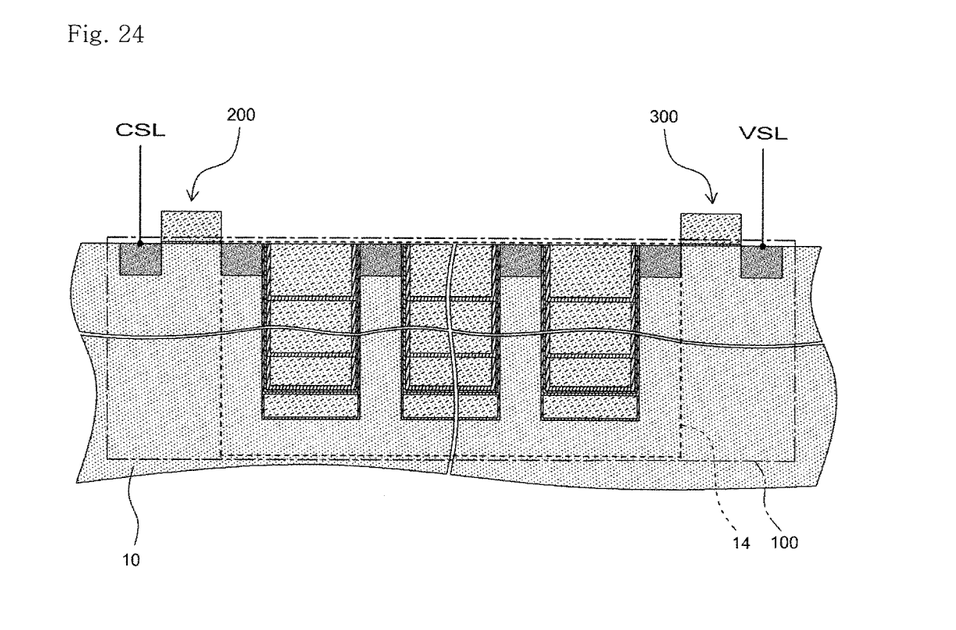
FIG. 24 is a cross-section of a semiconductor strip at discretion in the structure of FIG. 23 showing the connections to the external connect lines through the first and the second selective transistors formed at both ends of the semiconductor strip.

Therefore, according to the embodiments of the present invention, each semiconductor strip can be formed only in a bit line forming region, in words, a memory cell forming region 14 as shown in FIG. 22, but also formed extensively in a whole active region 100 which is including a first selective transistor 200 and a second selective transistor 300 connected to the bit line as shown in FIG. 24.

Figure 25:
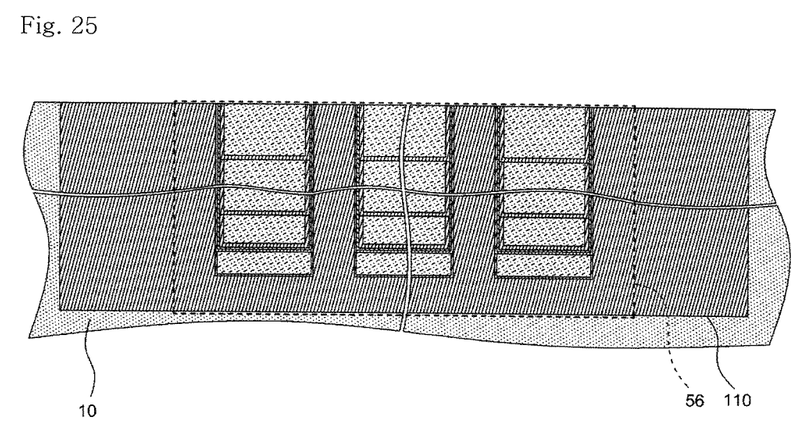
FIG. 25 is a cross-section of an insulator strip at discretion in the structure of FIG. 23 showing the insulation between the bit lines and the first and the second selective transistors by the insulator strip.

In the later case, the formation of each insulator strip, as shown in FIG. 25, can be extended from the region 56 in which same insulating pillars are repeatedly formed for insulating the memory cell forming region 14 to a field region 110 against the whole active region 100.

An embodiment of a wire connection, i.e., an electrical connection, to operate the array structure is described with respect to FIG. 24. One end of the bit line (BL1 or BL2) is connected to a common source line (CSL) through one 200 of a plurality of first selective transistors, and the other end of the bit line is connected to a voltage supply line (VSL) through one 300 of a plurality of second selective transistors, a gate of each first selective transistor is connected electrically to one of a plurality of first selective lines, and a gate of each second selective transistor is connected electrically to one of a plurality of second selective lines.

Because the method for operating the array structure is similar to the disclosed method in Korean patent application number 10-2008-0014125 (i.e., Korean publication number 10-2009-0088693) invented by the same inventors of the present invention, its explanation is omitted. But the preferred embodiments of the present invention are further described regarding the wire connection.

By considering the wire connection, the embodiments of the present invention are split into as the followings according to the structure of each semiconductor strip.

A first embodiment is embodied as that each semiconductor strip of the present invention is formed only in the bit line forming region, in words, the memory cell forming region 14 as shown in FIG. 22. In this case, the first selective transistor 200 and the second selective transistor 300 are formed at neighboring both ends of each semiconductor strip 14, respectively, on the semiconductor substrate 10 and a source or a drain of the first selective transistor 200 and a source or a drain of the second selective transistor 300 are connected electrically to the impurity-doped layer 16 formed in each upper part of the semiconductor pillars placed at both ends of each semiconductor strip, respectively.

At this time, of cause, the impurity-doped layers 16 formed in each upper part of the semiconductor pillars placed at both ends of each semiconductor strip can be shared with the source or drain of the first selective transistor 200 and the source or drain of the second selective transistor 300, respectively.

In the above case, a field oxide layer is formed additionally in each side of each first selective transistor and each second selective transistor for electrical isolation of the other first and the other second selective transistors that are connected to the neighboring bit lines.

A second embodiment is embodied as that each semiconductor strip of the present invention is extended to a whole active region which is formed the first selective transistor and the second selective transistor connected to the bit line as shown in FIG. 24. In this case, the first selective transistor 200 and the second selective transistor 300 are formed on each upper part of both ends of each semiconductor strip 100, respectively, and are insulated electrically from the other first and the other second selective transistors connected to the neighboring bit lines by each insulator strip 110 as shown in FIG. 25.

Because each semiconductor strip and each insulator strip of the present invention are formed by etching a semiconductor substrate 10, all of the above embodiments have an advantage of forming, by one unit, the first and the second selective transistors connected to both sides of each bit line together with a memory block formed in a region 14 in FIG. 24.

Next, with respect to FIGS. 1 to 22, a method for fabricating the embodiment of the array structure is described in a different mode of the present invention.

Figure 1:
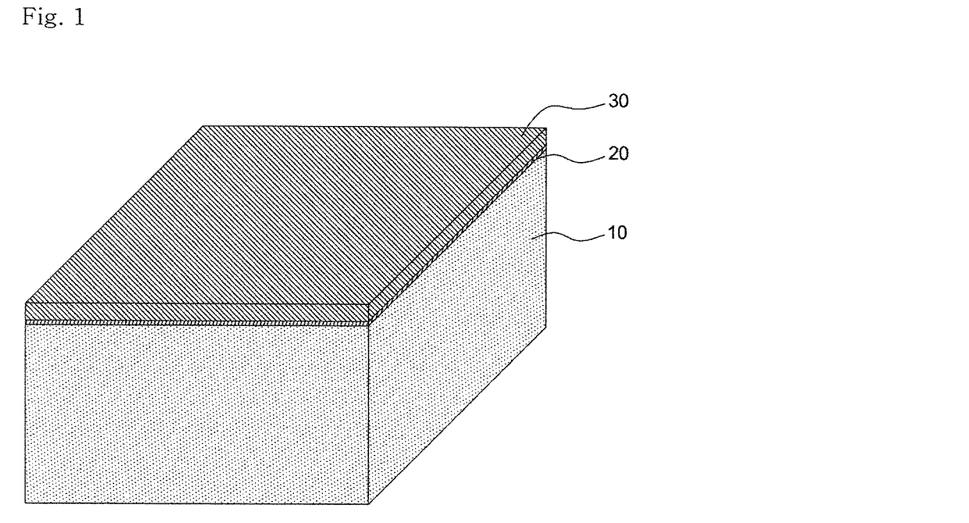
FIGS. 1 to 22 are process perspective views showing one example of a method for fabricating a 3D stacked array having cut-off gate line of the present invention.
Figure 2:
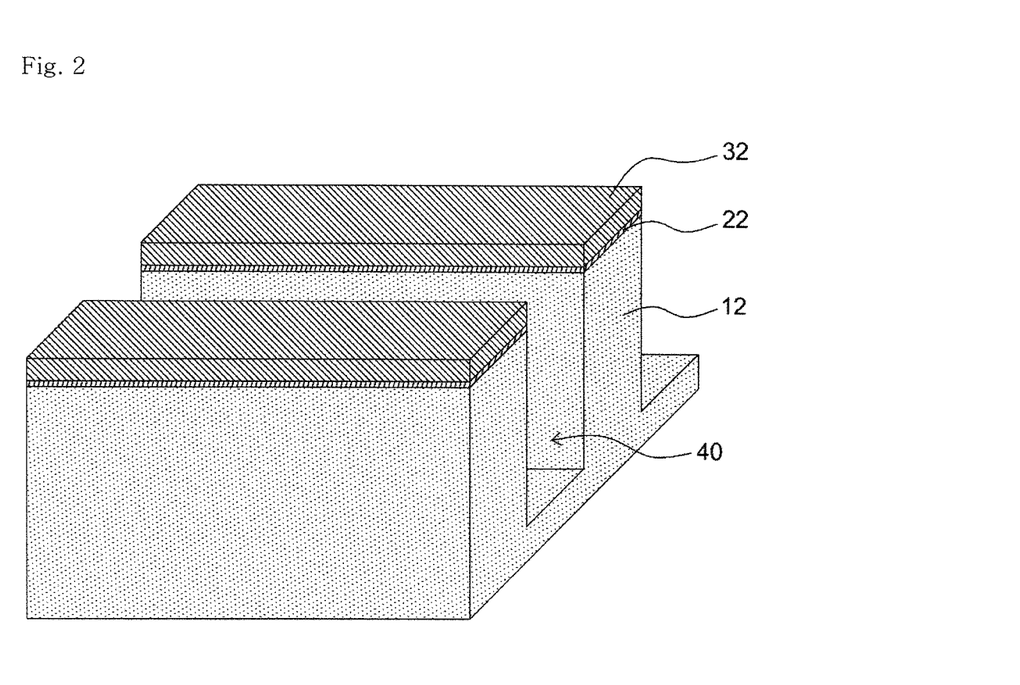

First, as shown in FIGS. 1 and 2, after forming a first etching mask 22 and 32 to define an active region on a prepared semiconductor substrate 10, the first etching mask is used to etch the substrate 10 for forming one or more semiconductor fins 12 and trenches 40 (a first step).

Here, the semiconductor substrate 10 and the semiconductor fin 12 can be made up with a single crystal silicon bulk substrate or an SOI substrate and silicon fin, respectively. The first etching mask 22 and 32 can be formed by stacking sequentially an oxide layer 20 and a nitride layer 30 on the prepared silicon substrate 10 as shown in FIG. 1, and etching reverse sequentially them as shown in FIG. 2. But the first etching mask 22 and 32 can also be made up with any other materials having a high etching selectivity ratio with silicon.

And, the depth of the trench 40, i.e., the height of the semiconductor fin 12 is determined with respect to conductive material layers to be stacked in hereafter process, and the active region is preferable to include a region where first and second selective transistors will be formed at both ends of the semiconductor fin 12, respectively, in hereafter process.

Figure 3:
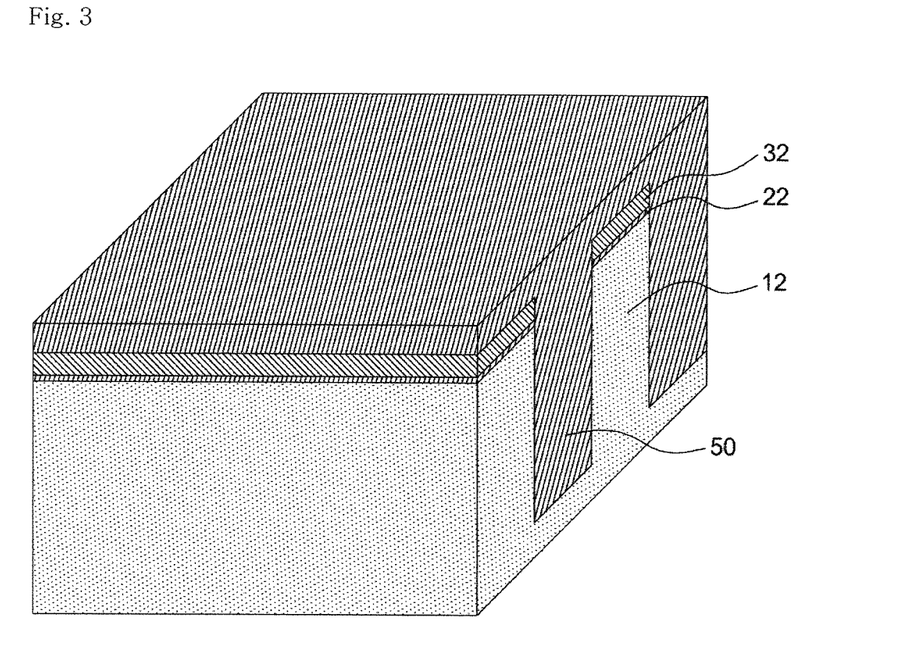
Figure 4:
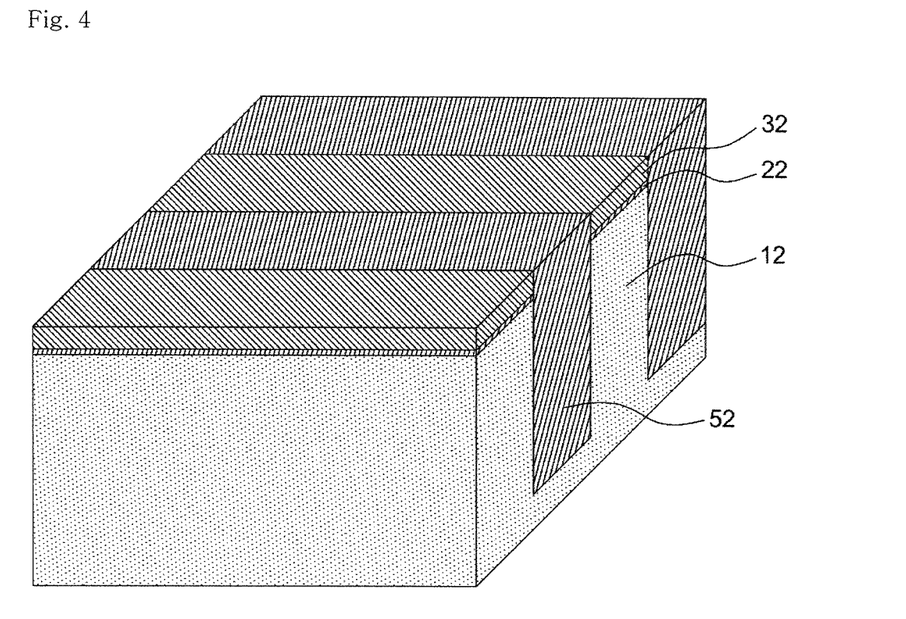

Next, as shown in FIG. 3, an insulating material (e.g., an oxide layer) 50 is deposited on a whole surface of the substrate to fill the space between the semiconductor fins 12, and then the insulating material 50 is etched and planarized (a second step).

At this time, it is preferable to use a nitride layer 32 of the first etching mask 22 and 32 as an etching stopper and to use the known CMP process for planarization.

Figure 8:
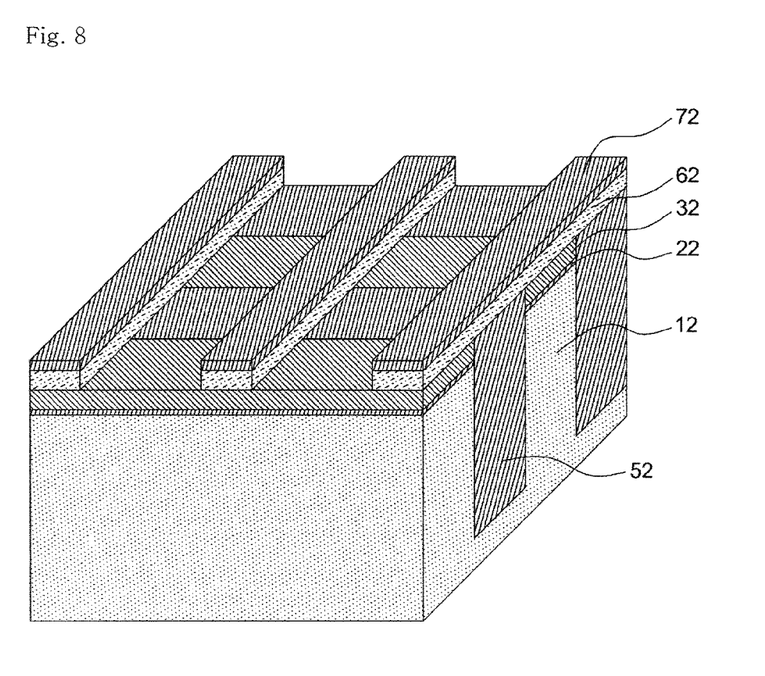
Figure 9:
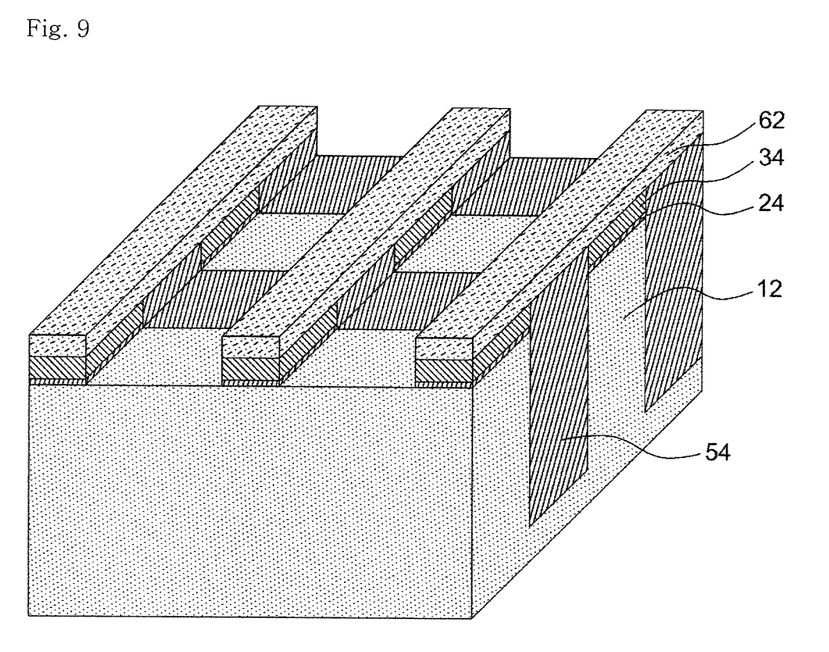
Figure 10:
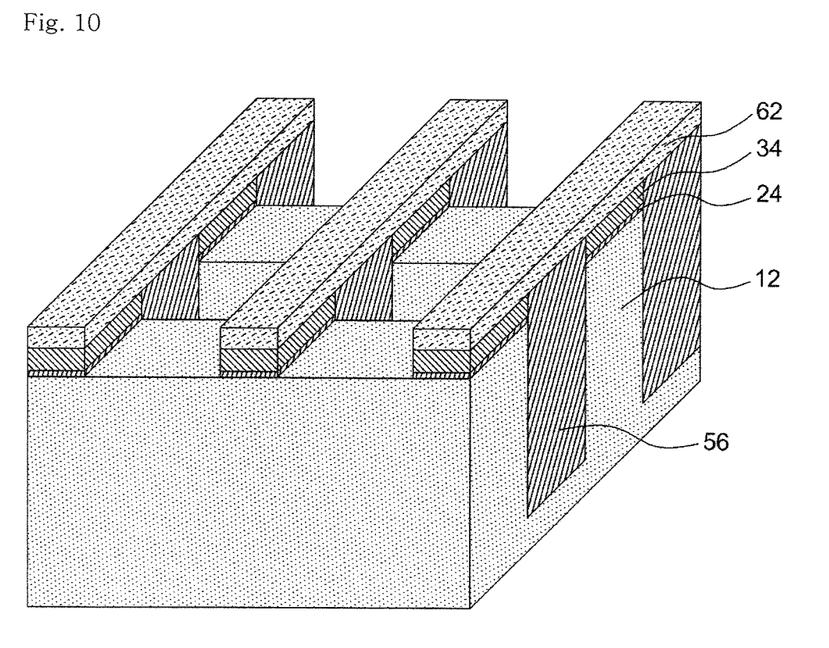

After this, as shown in FIG. 8, a second etching mask 62 and 72 is formed in a vertical direction to a direction of an opened pattern of the first etching mask 22 and 32 on the planarized substrate, and, through a process shown in FIG. 9, the opened first etching mask 22 and 32 and the insulating material 52 and 54 filled between the semiconductor fins 12 is etched by using the second etching mask to form one or more insulator strip 56 with projected insulating pillars as shown in FIG. 10 (a third step).

Figure 5:
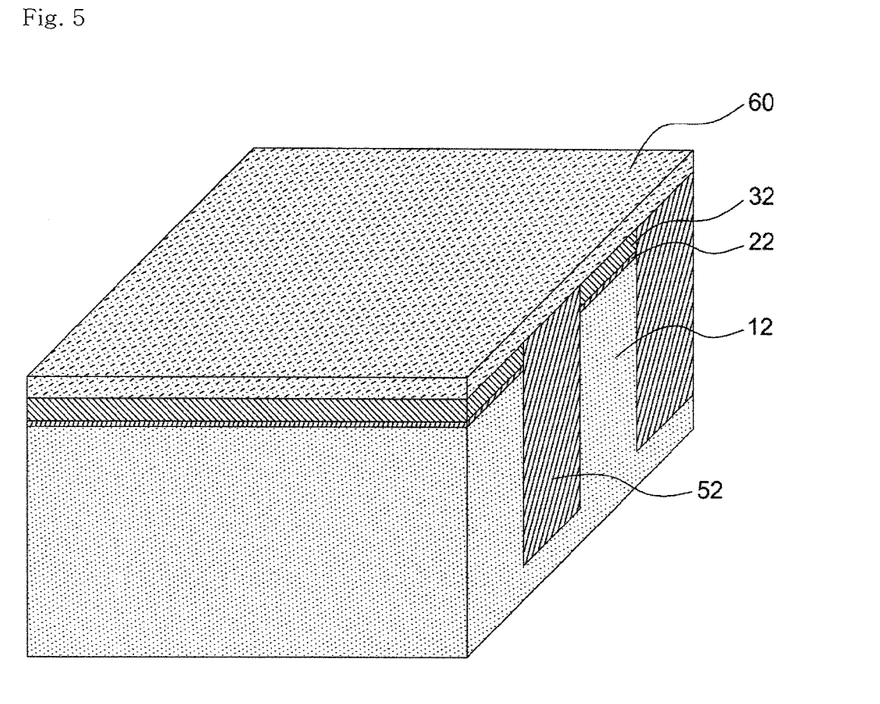
Figure 6:
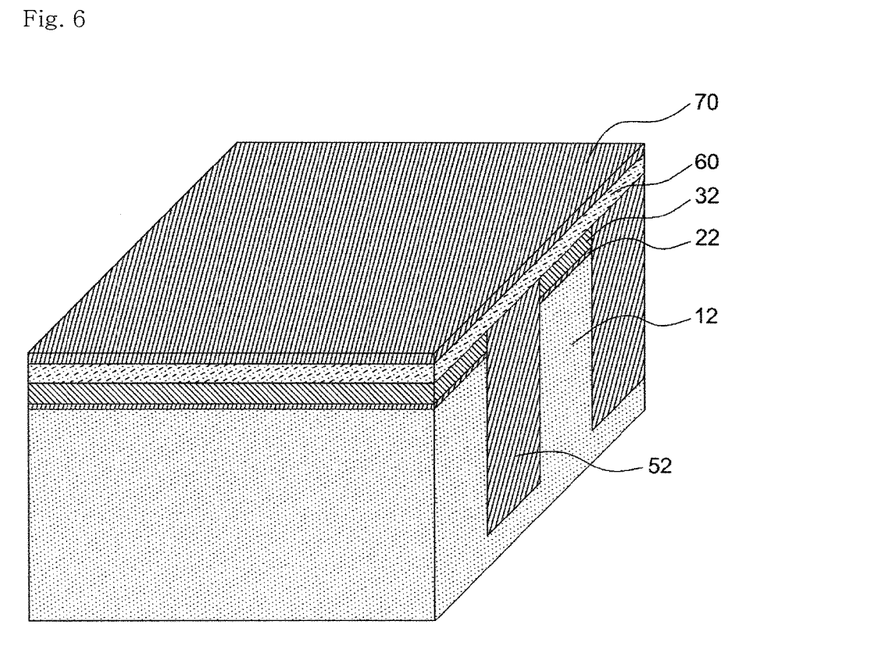
Figure 7:
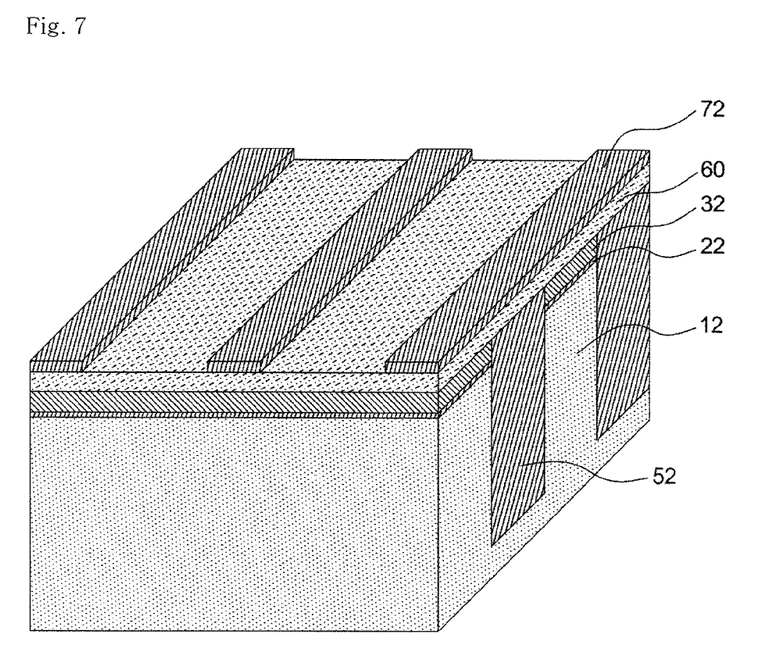

Here, when the substrate 10 is a silicon, as shown in FIGS. 5 and 6, it is preferable that a silicon-based material (e.g., a poly silicon or an amorphous silicon) 60 and an oxide layer 70 are stacked sequentially on the planarized substrate and etched reversely as shown in FIGS. 7 and 8, to form the second etching mask 62 and 72 in the vertical direction to the direction of the opened pattern of the first etching mask 22 and 32. At this time, the oxide layer 72 of the second etching mask is removed in a process for forming one or more insulator strips 56 as shown in FIG. 9.

Figure 11:
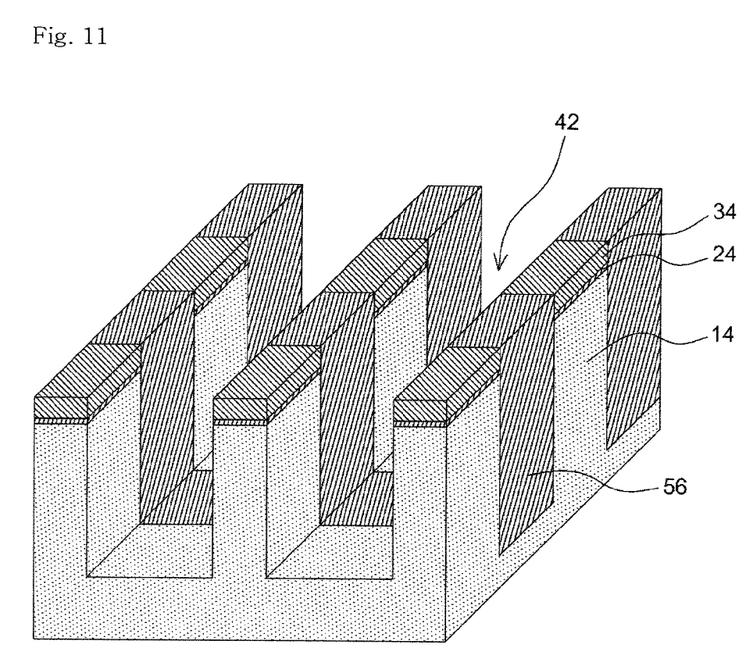

Next, the semiconductor fins 12 are etched by using the remained first etching mask 24 and 34 covered by the second etching mask 62 to form one or more semiconductor strips 14 with projected semiconductor pillars neighbor and parallel to each insulator strip 56 and to form one or more trenches 42 between the pillars as shown in FIG. 11 (a fourth step).

Here, when the substrate 10 is a silicon, the one or more semiconductor strips 14 become one or more silicon strips with silicon pillars, and the one or more trenches are formed by etching silicon fins 12 with the remained first etching mask 24 and 34 which is exposed by removing a silicon-based material 62 of the second etching mask.

Figure 12:
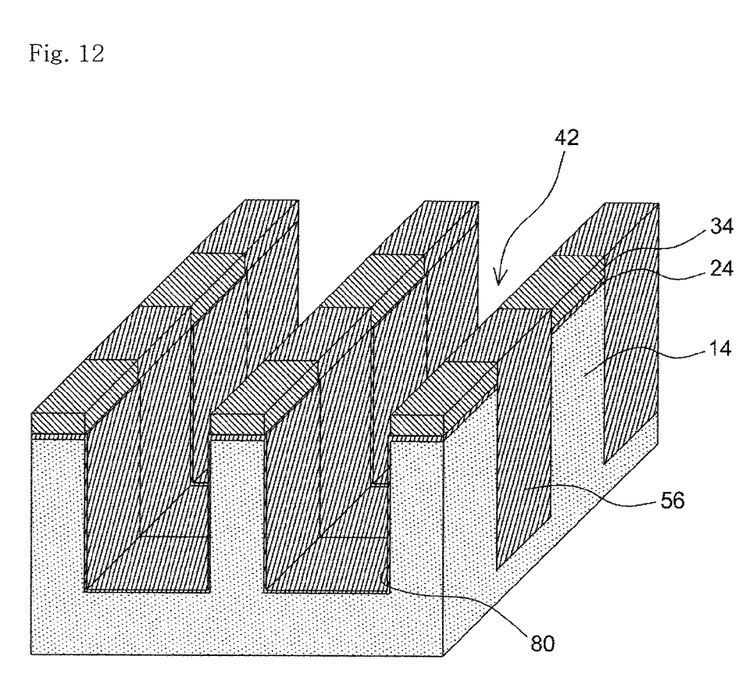

Next, as shown in FIG. 12, a gate insulating layer 80 is formed at least on each semiconductor strip in each trench 42 (a fifth step).

At this time, a thermal oxidation process is preferably used to form the gate insulating layer 80.

Figure 13:
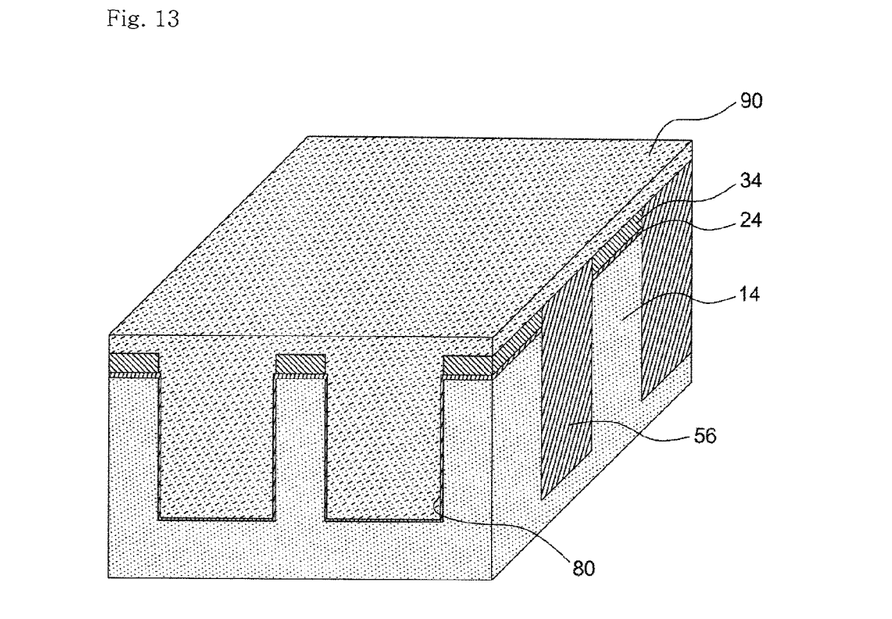
Figure 14:
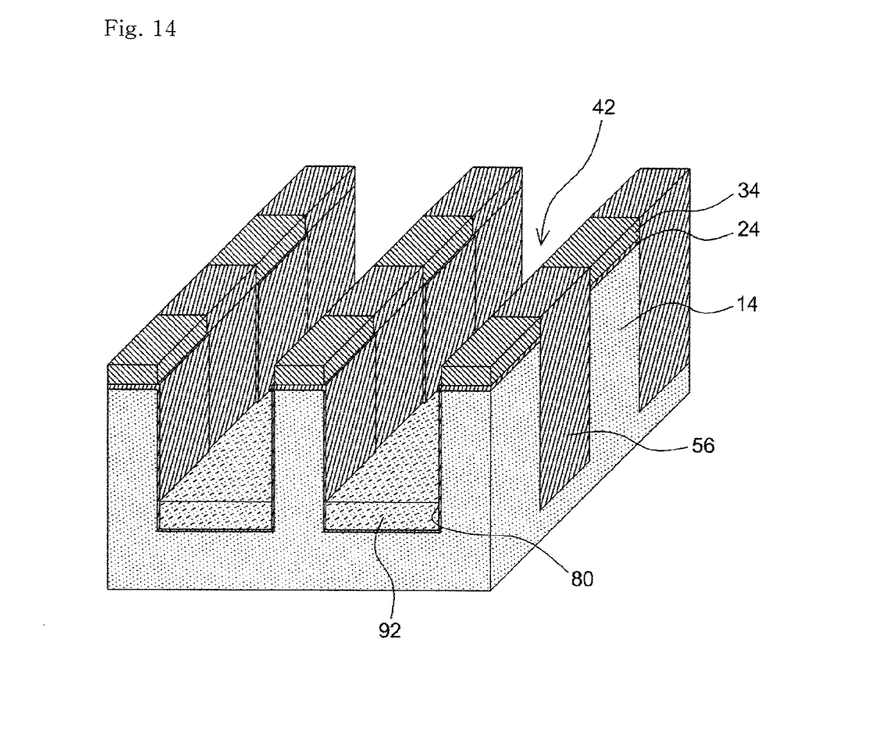

Next, as shown in FIGS. 13 and 14, a conductive material (e.g., a metal or an impurity-doped semiconductor material) 90 is deposited on a whole surface of the substrate and etched for forming a cut-off gate line 92 on the gate insulating layer 80 in each trench 42 (a sixth step).

After this, as shown in FIGS. 16 to 20, insulating materials 84 and the conductive material 90 are repeatedly deposited on a whole surface of the substrate and etched for forming insulating layers 84' with a charge storage layer 83 from each side wall of the trench 42 and two or more stacked word lines 94 and 96 interlaid with an interlayer insulating layer 84' or 87 from bottom side of the trench 42 on the cut-off gate line 92 in each trench 42 (a seventh step).

Figure 15:
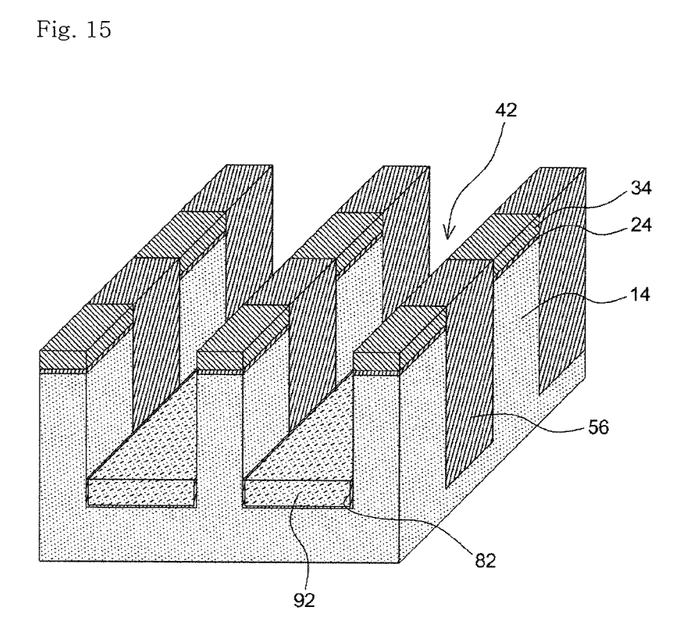
Figure 16:
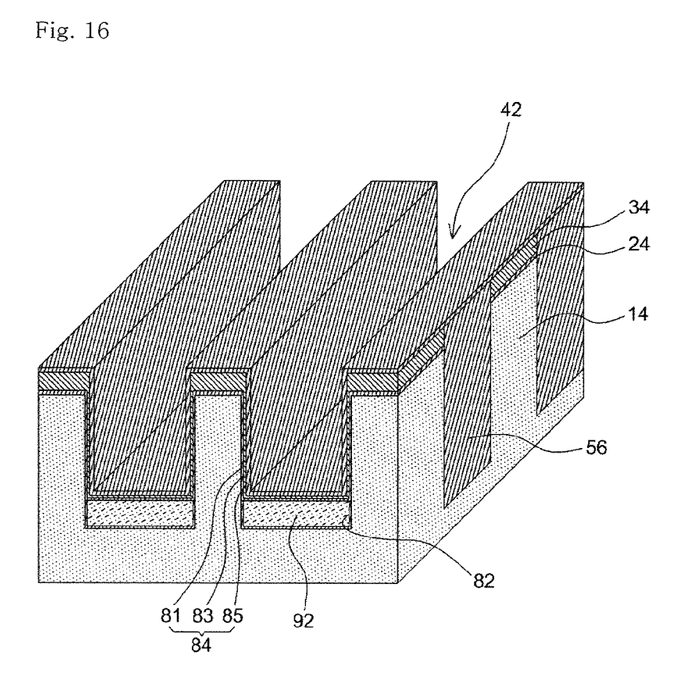
Figure 17:
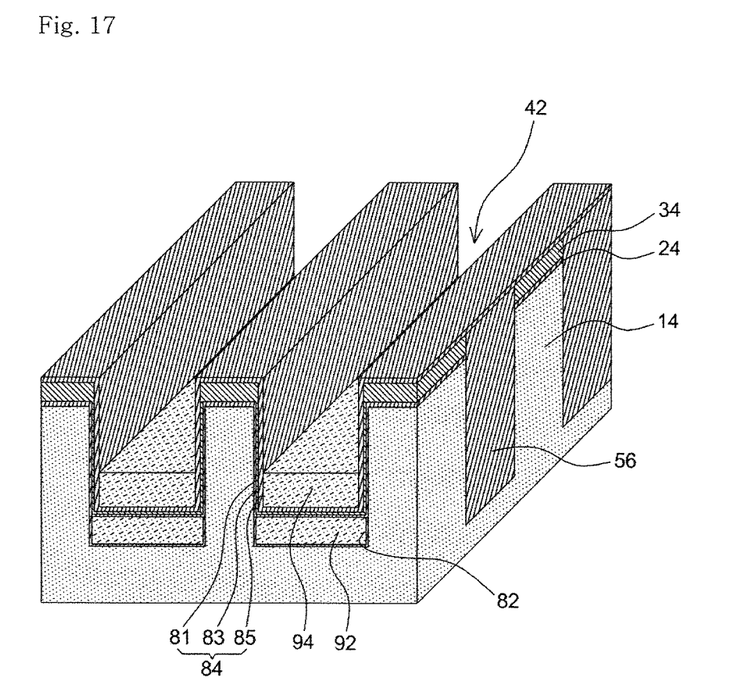
Figure 20:
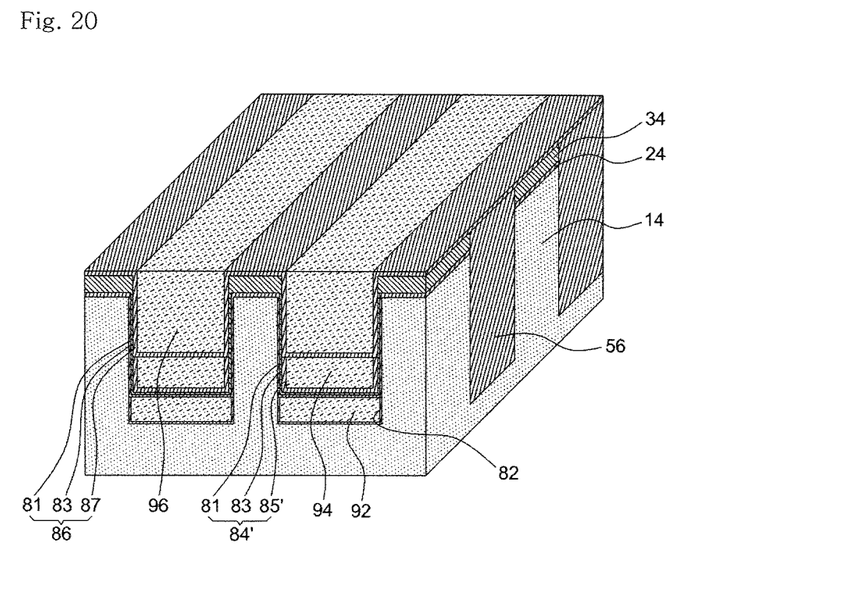

Here, the forming process of two or more stacked word lines can be consisted of two steps: a 7-1 step of removing the gate insulating layer 80 which is exposed after the sixth step as shown in FIG. 15, and forming insulating layers 84 with a charge storage layer 83 on a whole surface of the substrate as shown in FIG. 16; and a 7-2 step of forming two or more conductive material layers 94 and 96 interlaid with an interlayer insulating layer 84' or 87, as shown in FIG. 20, by depositing and etching alternatively a conductive material 90 and an interlayer insulating layer 84' or 87 on a whole surface of the substrate.

Figure 18:
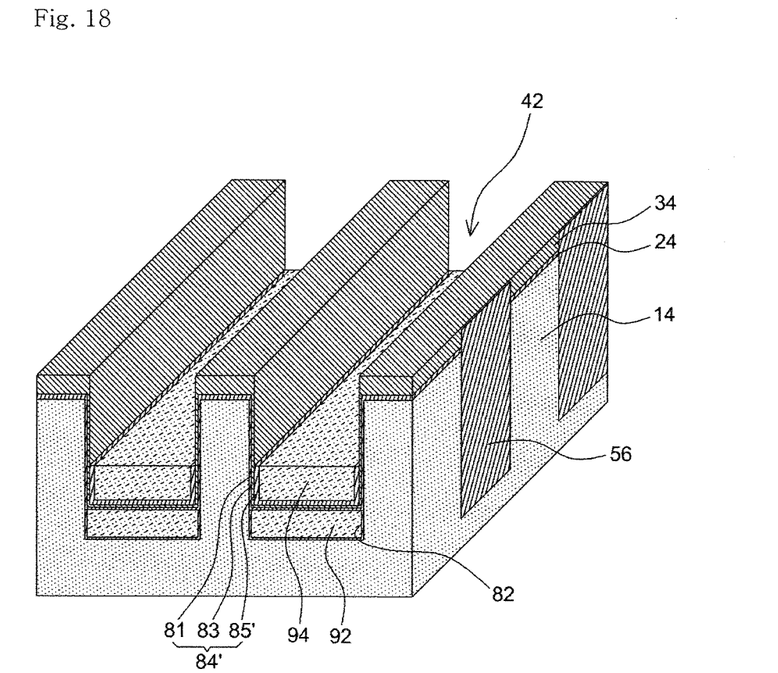
Figure 19:
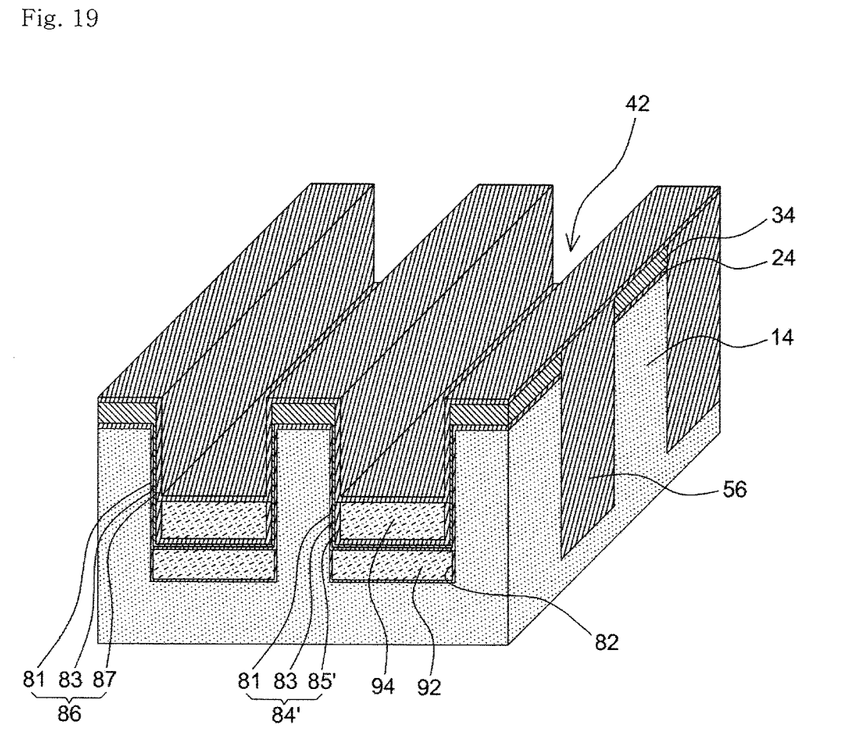

At this time, the insulating layer 84' with the charge storage layer can be formed, as shown in FIG. 18, sequentially with a tunneling oxide layer 81, a nitride layer 83 as a charge storage layer, and a blocking oxide layer 85' from each side wall of the trench 42. In the forming process of two or more conductive material layers, the blocking oxide layer 85 which is exposed after forming each conductive material layer 94 can be removed as shown in FIG. 18 and a new blocking oxide layer 87 can be formed at the same time together with a next interlayer insulating layer as shown in FIG. 19.

To form an impurity-doped layer 16 in the upper part of each semiconductor strip 14 after the 7-2 step, first the exposed blocking oxide layer 87 and the remained first etching mask 24 and 34 are removed as shown in FIG. 21 (a eighth step), and the impurity-doped layer 16 can be formed by ion injection (i.e., implantation) in the upper part of each semiconductor strip 14 as shown in FIG. 22 (a ninth step). As another embodiment, the impurity-doped layer 16 can be formed previously by ion injection in the prepared substrate 10 before forming the first etching mask in the first step.

The former method has an advantage of forming the source/drain of the first and the second selective transistors connected to each bit line at the same time.

By the above-mentioned, the preferable embodiments of the present invention are described in detail, but it has to be not limited to interpret the embodiments described herein. Of cause, a person having ordinary skill in the art can be variously modified and embodied. For example, the basic structure of the cut-off gate line and a plurality of word lines stacked by etching semiconductor substrate and the method for fabricating the same can be applied or modified variously to embody.

What is claimed is:

1. A three-dimensional stacked array having cut-off gate lines, comprising:

a plurality of insulator strips formed in a word line direction and spaced apart with a regular interval so that each of the insulator strips has at least one neighboring insulator strip, each of the insulator strips having an insulating bottom line and projected insulating pillars formed of the same material in a bit line direction and at a regular interval on an etched semiconductor substrate;

a plurality of semiconductor strips formed in the word line direction between the neighboring insulator strips, each of the semiconductor strips having a semiconductor bottom line and projected semiconductor pillars formed of the etched semiconductor substrate in the bit line direction with the same shape as each of the insulator strips;

a plurality of cut-off gate lines formed in lower parts of trenches formed by the insulator strips and the semiconductor strips, a gate insulating layer being formed between each of the semiconductor strips and each of the cut-off gate lines;

insulating layers having a tunneling oxide layer, a charge storage layer and a blocking oxide layer formed sequentially from and on each side wall of each of the trenches and each of the cut-off gate lines; and a plurality of word lines stacked on the insulating layers over each of the cut-off gate lines in each of the trenches, the word lines being interlaid with the same layer as the blocking oxide layer, wherein the upper part of each of the projected semiconductor pillars is doped with impurities to have an impurity-doped layer and to form a bit line by each semiconductor strip, each of the semiconductor strips is formed of a single crystal semiconductor material having the same conductivity type except the upper parts doped with the impurities, the insulating bottom line is the region of each of the insulator strips that extends in the bit line direction under the cut-off gate lines, and the semiconductor bottom line is the region of each of the semiconductor strips that extends in the bit line direction under the cut-off gate lines.

2. The three-dimensional stacked array having cut-off gate lines of claim 1,
wherein the charge storage layer is made up with an insulating material that has an electron-trapping characteristic.

3. The three-dimensional stacked array having cut-off gate lines of claim 2,
wherein one end of the bit line is connected to a common source line through one of a plurality of first selective transistors, and the other end of the bit line is connected to a voltage supply line through one of a plurality of second selective transistors,
a gate of each of the first selective transistors is connected electrically to one of a plurality of first selective lines, and
a gate of each of the second selective transistors is connected electrically to one of a plurality of second selective lines.

4. The three-dimensional stacked array having cut-off gate lines of claim 3,
wherein each of the first selective transistors and each of the second selective transistors are formed neighboring both ends of each semiconductor strip, respectively, on the semiconductor substrate, and
a source or a drain of each of the first selective transistors and a source or a drain of each of the second selective transistors are connected electrically to the impurity-doped layer formed in each upper part of the projected semiconductor pillars located at both ends of each semiconductor strip, respectively.

5. The three-dimensional stacked array having cut-off gate lines of claim 3,
wherein each of the first selective transistors and each of the second selective transistors are formed on each upper part of both ends of each semiconductor strip, respectively, and are insulated by each insulator strip from the other neighboring first selective transistors and the other neighboring second selective transistors that are connected to neighboring bit lines, respectively.

6. A three-dimensional stacked array having cut-off gate lines, comprising:
a plurality of insulator strips formed in a word line direction and spaced apart with a regular interval so that each of the insulator strips has at least one neighboring insulator strip, each of the insulator strips having an insulating bottom line and projected insulating pillars formed of the same material in a bit line direction and at a regular interval on an etched semiconductor substrate;
a plurality of semiconductor strips formed in the word line direction between the neighboring insulator strips, each of the semiconductor strips having a semiconductor bottom line and projected semiconductor pillars formed of the etched semiconductor substrate in the bit line direction with the same shape as each of the insulator strips;
a plurality of cut-off gate lines formed in lower parts of trenches formed by the insulator strips and the semiconductor strips, a gate insulating layer being formed between each of the semiconductor strips and each of the cut-off gate lines;

insulating layers having a tunneling oxide layer, a charge storage layer and a blocking oxide layer formed sequentially from and on each side wall of each of the trenches and each of the cut-off gate lines; and
a plurality of word lines stacked on the insulating layers over each of the cut-off gate lines in each of the trenches, the word lines being interlaid with the same layers as the insulating layers,
wherein
the upper part of each of the projected semiconductor pillars is doped with impurities to have an impurity-doped layer and to form a bit line by each of the semiconductor strips,
each of the semiconductor strips is formed of a single crystal semiconductor material having the same conductivity type except the upper parts doped with the impurities,
the insulating bottom line is the region of each of the insulator strips that extends in the bit line direction under the cut-off gate lines, and
the semiconductor bottom line is the region of each of the semiconductor strips that extends in the bit line direction under the cut-off gate lines.

7. The three-dimensional stacked array having cut-off gate lines of claim 6,
wherein the charge storage layer is made up with an insulating material that has an electron-trapping characteristic.

8. The three-dimensional stacked array having cut-off gate lines of claim 7,
wherein one end of the bit line is connected to a common source line through one of a plurality of first selective transistors, and the other end of the bit line is connected to a voltage supply line through one of a plurality of second selective transistors,
a gate of each of the first selective transistors is connected electrically to one of a plurality of first selective lines, and
a gate of each of the second selective transistors is connected electrically to one of a plurality of second selective lines.

9. The three-dimensional stacked array having cut-off gate lines of claim 8,
wherein each of the first selective transistors and each of the second selective transistors are formed neighboring both ends of each semiconductor strip, respectively, on the semiconductor substrate, and
a source or a drain of each of the first selective transistors and a source or a drain of each of the second selective transistors are connected electrically to the impurity-doped layer formed in each upper part of the projected semiconductor pillars located at both ends of each semiconductor strip, respectively.

10. The three-dimensional stacked array having cut-off gate lines of claim 8,
wherein each of the first selective transistors and each of the second selective transistors are formed on each upper part of both ends of each semiconductor strip, respectively, and are insulated by each insulator strip from the other neighboring first selective transistors and the other neighboring second selective transistors that are connected to neighboring bit lines, respectively.

* * * * *